United States Patent
Zhang et al.

(10) Patent No.: US 9,601,414 B2
(45) Date of Patent: *Mar. 21, 2017

(54) METHOD FOR PREVENTING DIE PAD DELAMINATION

(71) Applicant: Texas Instruments Incorporated, Dallas, TX (US)

(72) Inventors: Rongwei Zhang, Dallas, TX (US); Abram Castro, Fort Worth, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/968,234

(22) Filed: Dec. 14, 2015

(65) Prior Publication Data

US 2016/0181183 A1    Jun. 23, 2016

Related U.S. Application Data

(63) Continuation of application No. 14/573,071, filed on Dec. 17, 2014, now Pat. No. 9,214,440.

(51) Int. Cl.
*H01L 23/495* (2006.01)
*H01L 23/00* (2006.01)
(Continued)

(52) U.S. Cl.
CPC .... *H01L 23/49513* (2013.01); *H01L 21/4825* (2013.01); *H01L 21/565* (2013.01); *H01L 23/3114* (2013.01); *H01L 23/3142* (2013.01); *H01L 23/49541* (2013.01); *H01L 23/49582* (2013.01); *H01L 23/49586* (2013.01); *H01L 23/562* (2013.01); *H01L 24/03* (2013.01); *H01L 24/04* (2013.01); *H01L 24/26* (2013.01); *H01L 24/28* (2013.01); *H01L 24/83* (2013.01); *H01L 23/3121* (2013.01); *H01L 24/29* (2013.01); *H01L 24/32* (2013.01); *H01L 24/45* (2013.01); *H01L 24/48* (2013.01); *H01L 24/73* (2013.01); *H01L 24/92* (2013.01); *H01L 2224/2919* (2013.01); *H01L 2224/32245* (2013.01); *H01L 2224/45124* (2013.01); *H01L 2224/45144* (2013.01); *H01L 2224/45147* (2013.01); *H01L 2224/48247* (2013.01);
(Continued)

(58) Field of Classification Search
CPC ......... H01L 23/49513; H01L 23/49541; H01L 23/49582; H01L 23/49586; H01L 23/562; H01L 21/4825; H01L 21/565
USPC .................................................. 257/666, 676
See application file for complete search history.

(56) References Cited

U.S. PATENT DOCUMENTS 9,214,440 B1 * 12/2015 Zhang .................... H01L 24/04

* cited by examiner

*Primary Examiner* — Tu-Tu Ho
(74) *Attorney, Agent, or Firm* — Jacqueline J. Garner; Charles A. Brill; Frank D. Cimino

(57) ABSTRACT

The invention is directed to a method for inhibiting or preventing delamination at the interface of the die attach/mold compound and the die pad of a semiconductor device and a semiconductor device formed by such method. The method includes providing a leadframe having a top surface; coating the top surface of the leadframe with first and second silane coating; heating the silane coatings to form a porous layer having a porosity of at least 10%; applying a die to the porous layer; securing the die to the porous layer by a die attaching compound; and after the curing of die attach material and wire bonding, a mold compound is applied through molding.

19 Claims, 2 Drawing Sheets

(51) Int. Cl.
  *H01L 21/48* (2006.01)
  *H01L 21/56* (2006.01)
  *H01L 23/31* (2006.01)
(52) U.S. Cl.
  CPC ............... *H01L 2224/73265* (2013.01); *H01L 2224/83055* (2013.01); *H01L 2224/83075* (2013.01); *H01L 2224/83385* (2013.01); *H01L 2224/83439* (2013.01); *H01L 2224/83444* (2013.01); *H01L 2224/83447* (2013.01); *H01L 2224/83455* (2013.01); *H01L 2224/83862* (2013.01); *H01L 2224/92247* (2013.01)

METHOD FOR PREVENTING DIE PAD DELAMINATION

BACKGROUND

This application is a Continuation of and claims priority to U.S. patent application Ser. No. 14/573,071, filed Dec. 17, 2014, now U.S. Pat. No. 9,214,440. Said Patent is incorporated herein by reference in its entirety.

BACKGROUND

Field

The present application is directed to a method for inhibiting or preventing delamination at the interface of the die attach/mold compound and the die pad of a semiconductor device.

BACKGROUND

The disclosure herein relates in general to electronic circuitry, and in particular to a method and circuitry for inhibiting or preventing delamination at the interface of the die attach/mold compound and the die pad of a semiconductor device.

A leadframe-based semiconductor device package is a commonly used integrated circuit (IC) package. The leadframe typically includes a chip mount pad (also referred to as a die paddle) for attaching the IC die or chip to the leadframe, and a plurality of lead fingers or conductive segments which provide a conductive path between the chip and external circuits. A gap between the inner end of the lead fingers and the chip is typically bridged with bond wires attached to bond pads on the chip and to the inner end of the lead fingers. Bond wires can be formed from various materials, such as gold, copper, aluminum, or an alloy thereof. The outer ends of the lead fingers remote from the IC chip can be electrically and mechanically connected to external circuitry. After assembly of the chip to the leadframe, the chip, the bond wires, and a portion of the leadframe can be encapsulated in mold compound. Non-limiting examples of leadframe-based semiconductor devices are disclosed in U.S. Pat. Nos. 7,045,456; 7,268,073; 8,133,761; 8,304,871; and U.S. Publication Nos. 2007/0273010; 2010/0193944; 2013/0075890; 2013/02778816; 2013/0277825; and 2014/0191378, which are incorporated herein by reference.

As the encapsulated semiconductor device undergoes temperature cycling during device testing or use, it is known that thermomechanical stresses are induced at the joints or interfaces between dissimilar materials used in the fabrication of the device. The stresses are primarily induced due to differences between the coefficients of thermal expansion (CTE) of the various materials. For example, metal used to fabricate the leadframe assembly expands or contracts differently than plastic resin material used as the mold compound, thereby causing delamination of the mold compound from the leadframe. These stresses, which may be repeatedly induced during hundreds or thousands of temperature cycles, tend to fatigue the joints and the interfaces and can result in separation between the leadframe and the mold compound. If delamination occurs, the device can fail as a result of physical damage during separation or from corrosion resulting from the intrusion of moisture or an impurity into the delaminated package.

Die pad delamination can also occur during high temperature storage (HTS) of the semiconductor device. During HTS, the semiconductor device can be exposed to temperatures equal to or greater than 200° C. for extended periods of time. It has been observed that long-term storage of semiconductor devices at >=200° C. for >2000 hours can readily lead to die pad delamination. The delamination is partly or fully due to the degradation of the interfacial interaction at the interface of the die attach/mold compound and the leadframe.

Various strategies have been used to address the delamination problems. One strategy includes the use of adhesion promoters in die attach or mold compound formulations. The adhesion promoter is used to increase the strength of adhesion between the interface of die attach/mold compound and leadframe. However, increased amounts of adhesion promoters in die attach material increase material cost and do not always result in improved adhesion. Also, increased use of adhesion promoters can adversely affect the die attach properties, such as the formation of voids during curing, thus decreasing, rather than increasing, the strength of adhesion between the interface of the die attach and the leadframe. Another past practice to address the delamination problem was to roughen the leadframe using chemical or mechanical processes. The roughening of the leadframe will increase the surface area of adhesion, thus improving adhesion and decreasing the incidence of delamination. In some, but not all, applications, the roughening of the leadframe would improve delamination; however, the additional processing step of roughening the leadframe added to the significant manufacturing costs of the semiconductor device. Roughening of the leadframe can also result in bleeding problems which can adversely affect the properties of the semiconductor device. Another past practice to address the delamination problem was to plasma clean the leadframe prior to attaching the die to the leadframe. The plasma cleaning of the surface of the leadframe, while not as effective as roughening the surface of the leadframe, could be used to promote adhesion between die attach/mold compound to the leadframe. As such, in some, but not all, applications, the plasma cleaning of the leadframe could improve adhesion.

In view of the current state of the art, there is a continued need to inhibit or prevent delamination at the interface of the die attach/mold compound and the die pad of a semiconductor device without significantly increasing the complexity and/or costs of forming the semiconductor device.

SUMMARY

The present application is directed to a method for inhibiting or preventing delamination at the interface of the die attach/mold compound and the die pad of a semiconductor device. The method of the present invention includes the first step of applying a coating of organosilane to the surface of the leadframe to form a dense layer that has strong adhesion with leadframe surface. Thereafter, another organosilane is applied to the dense layer to form functional porous structures on the dense layer. These functional groups enable mechanical interlocking and covalent bonds between the die attach/mold compound and the die pad during the die attach and molding processes, thereby improving adhesion of the die to the leadframe and the mold compound to die pad. This novel method of attaching a die to a leadframe inhibits or prevents die pad delamination and also enables the use of lower-cost die attach materials without sacrificing delamination performance. The formation of first dense layer is used to enable strong adhesion between first layer and leadframe (i.e., die pad). The formation of mechanical interlocking and covalent bonds between the die attach/mold compound by use of a second layer of organosilane which is applied to the first layer of organosilane is an improvement over past adhesion methods.

For example, when larger amounts of adhesion promoter were used in die attach material formulations to improve adhesion, the increased use of adhesion promoters could adversely affect the properties of die attach material, such as the viscosity and voiding of die attach material. Also, only adhesion promoter molecules that migrated to the leadframe surface could be effective in improve adhesion. When increased amounts of adhesion promoter are added to the adhesion compound, other components in the formulation may interfere with the migration ability of the promoter molecules to the leadframe surface, thus reducing the effectiveness of the adhesion promoter added to die attach compound. Also, in past practices wherein the adhesion compound includes adhesion promoter, the adhesion of adhesion compound to the leadframe relied on the interaction of resins (including a small amount of adhesion promoters) with the metal surface of the leadframe. Such interactions were less effective or less strong than the interactions between the organosilane and the metal surface of the leadframe.

The roughening or plasma cleaning of the leadframe does not result in the formation of interpenetrating structures when using prior adhesion compounds. The formation of interpenetrating structure that is achieved in the method of the present invention is more effective in improving the adhesion between the interface of the die attach/mold compound and the die pad of a semiconductor device. The method of the present invention results in improved delamination performance for long time period, high temperature applications. The method of the present invention allows for the use of low cost die attach materials. The method of the present invention does not require die attach materials to have high adhesion to the metal leadframe.

In one non-limiting aspect of the present invention, there is provided a method to inhibit or prevent die pad delamination which includes the step of applying one or more coatings of an organosilane onto the surface of the leadframe. The one or more coatings can be applied by a variety of operations (e.g., spray coating, brushing, dip coating, inkjet printing, etc.). In one non-limiting example, the one or more coatings of organosilane are spray coated onto the surface of the leadframe. The metal surface of the leadframe can be optionally pretreated (e.g., roughened, plasma cleaned, etc.) prior to the application of one or more coatings of the organosilane onto the surface of the leadframe. Generally, the metal surface of the leadframe is typically cleaned prior to the application of the organosilane onto the surface of the leadframe; however, this is not required. The metal composition of the leadframe is non-limiting. Generally, the metal surface is gold or a gold alloy; however, the surface of the leadframe can be formed of or include other or additional metals (e.g., silver, copper, nickel, palladium, etc.). The thickness of the coating of organosilane on the surface of the leadframe is generally at least 10 nm and typically no more than 2 μm (e.g., 10 nm, 10.1 nm, 10.2 nm . . . 1.998 μm, 1.999 μm, 2 μm) and all values and ranges in between. The thickness of the coating of organosilane on the surface of the leadframe is generally no more than 50 microns (e.g., 0.1 micron, 0.101 microns, 0.102 microns . . . 49.998 microns, 49.999 microns, 50 microns) and all values and ranges in between; however, this is not required. In one non-limiting example, the thickness of the coating of organosilane on the surface of the leadframe is 1-25 microns (e.g., 1 micron, 1.001 microns, 1.002 microns . . . 24.998 microns, 24.999 microns, 25 microns) and all values and ranges in-between.

Several types of organosilanes can be used in the method of the present invention to form the first dense layer on the surface of the leadfame. In one non-limiting embodiment, the organosilane includes sulfur, nitrogen and/or phosphorous functional groups used in the first layer. Sulfur, nitrogen and phosphorous functional groups in the organosilane have been found to form a strong interaction with the metal surface of the lead frame. Non-limiting examples of organosilane include sulfur and/or phosphorous functional groups are bis[3-(triethoxysilyl)propyl]-tetrasulfide, 2-(Diphenylphosphino) ethyltriethoxysilane, (Aminoethylaminomethyl) phenethyltrimethoxysilane, and 3-Aminopropyltriethoxysilane. The coating of the surface of the leadframe with the organosilane results in a strong interaction covalent bond (e.g., Au—S chemical bond, Au—P chemical bond, Au—N chemical bond, Cu—S chemical bond, Cu—P chemical bond, Cu—N chemical bond, Ag—S chemical bond, Ag—P chemical bond, Ag—N chemical bond, Ni—S chemical bond, Ni—P chemical bond, Ni—N chemical bond, Pd—S chemical bond, Pd—P chemical bond, Pd—N chemical bond, etc.) being formed with the metallic leadframe. Such strong interaction covalent bond has high thermal stability, thus resisting thermal degradation during subsequent processes that involving curing, molding and high temperature applications. In one non-limiting embodiment, the organosilane has a boiling point of at least 120° C., typically of at least 130° C., more typically of at least 150° C., still more typically of at least 175° C., and still yet more typically of at least 200° C.; however, this is not required. As can be appreciated, the organosilane can have a boiling point of less than 120° C.

Once the first dense layer is formed on the surface of the leadframe, a second layer is formed on the surface of the first dense layer using a sol-gel process of organosilanes. The functional groups of organosilanes for the second layer include epoxy, amino, methacryloxy, or thiols. Non-limiting specific examples of silane used in the second layer that form porous structures include (3-Glycidyloxypropyl) trimethoxysilane, diethylaminotrimethylsilane (DEATS), Dow Corning® Z-6300 Silane, Dow Corning® Z-6011 Silane, Xiameter® OFS-6030 Silane, and Xiameter® OFS-6040 Silane. The sol-gel formation on the surface of the first dense layer is achieved by heating the organosilane for a period of time. Generally, the organosilane is heated at a temperature of at least 60° C. In one non-limiting embodiment, the organosilane is heated at a temperature 60° C.-200° C., typically 80° C.-150° C., and more typically 100° C.-120° C. The heating temperature can be constant or vary over the period of heating. The time period of heating the organosilane is generally at least 1 minute. The time period is generally less than 24 hours; however, this is not required. In one non-limiting embodiment, the time period of heating the organosilane is 3 minutes to 5 hours (e.g., 0.03 hours, 0.031 hours, 0.032 hours . . . 4.998 hours, 4.999 hours, 5 hours) and all values and ranges in-between. The organosilane is heated for a sufficient period of time so as to achieve a porosity of the sol-gel of at least 10%, and typically at least 20%. When the organosilane is first applied to the surface of the leadframe, the porosity of the coating is zero or nearly zero (e.g., less than 5%). During the conversion of the organosilane coating to a sol-gel coating, the porosity of the coating increases. The porosity of the coating should be at least 10% so that the die attaching compound can strongly bond to the sol-gel layer. Generally, the final porosity of the sol-gel is no greater than 60%. In one non-limiting embodiment, the sol-gel layer has an average porosity of 20%-60% (e.g., 20%, 20.01%, 20.02% . . . 59.98%, 59.99%, 60%) and all values or ranges in between. The formed sol-gel includes functional groups, such as epoxide and amino groups, that can bond to the die attaching compound, thereby increasing the bond strength between the sol-gel layer and the die attaching compound. The sol-gel layer is believed to also protect the first layer and resist thermal degradation when exposed to elevated temperatures, thereby resulting in the reduction of delamination of the die to the leadframe during reliability tests.

After the sol-gel layer has been formed, the next step of the method includes attaching the die to the sol-gel layer by use of a die attaching compound or die attach material. The die attaching compound generally includes an epoxy or acrylate compound (e.g., epoxy resin, etc.). The porous channels in the sol-gel layer enable the formation of mechanical interlocking between the sol-gel layer and the die attaching compound, and the functional groups in the sol-gel layer (e.g., amine group, epoxide group, etc.) at the pore channel wall react with the die attaching compound to form strong covalent bonds between the sol-gel layer and the die attaching compound. The formation of both mechanical interlocking and covalent bonds substantially improves the adhesion strength between the sol-gel layer and the die attaching compound, thus inhibiting or preventing die pad delamination. Generally, the die attaching compound is cured in an air environment or nitrogen environment for 2-120 minutes. The curing temperature is generally 150° C.-220° C.

Once the die attaching compound has been sufficiently cured and subsequent wire bonding are completed, a mold compound is applied over the die through molding. The mold compound is generally an epoxy compound. Generally, the mold compound is a different formulation from the die attaching compound; however, this is not required. Generally, the mold compound is cured in an air environment or nitrogen environment after molding for at least 10 minutes and generally 2 hours to 24 hours, and typically 4-8 hours. The curing temperature is generally 150° C.-250° C., and typically 175° C.-220° C. (e.g., 175° C., 175.1° C., 175.2° C. . . . 221.8° C., 221.9° C., 220° C.) and all values or ranges there between.

One non-limiting process for securing the die to a leadframe that can be used in combination with the method of the present invention is disclosed in U.S. Pat. No. 8,530,279, which is incorporated herein by reference.

These and other aspects and advantages of the present invention will become apparent to those skilled in the art upon reading and following the description taken together with the accompanying drawings.

DETAILED DESCRIPTION

Figure 1:
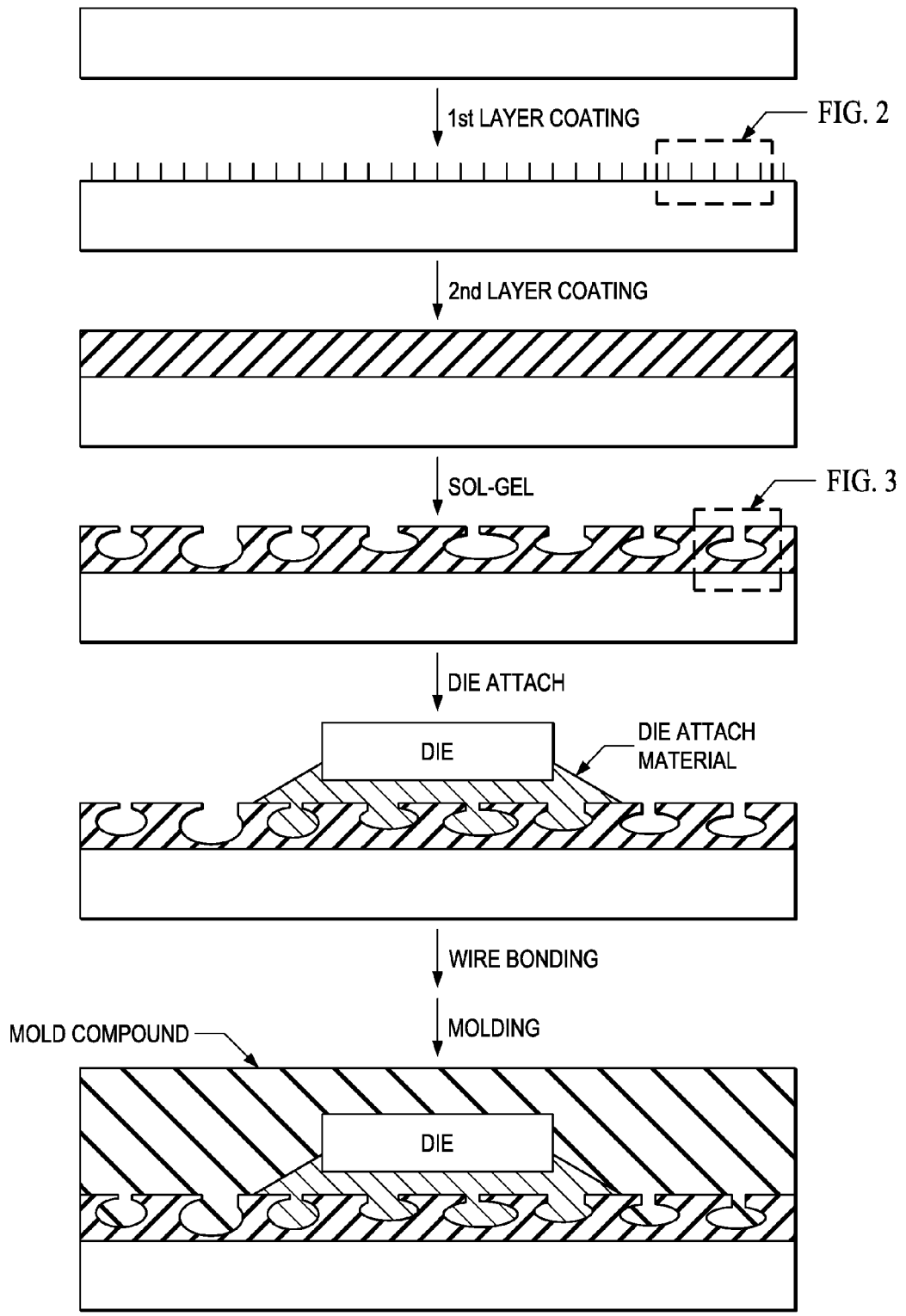
FIG. 1 is a block diagram of the method for adhering a die to a leadframe.

Referring now to the drawings wherein the showings are for the purpose of illustrating one non-limiting embodiments of the invention only and not for the purpose of limiting same, FIG. 1 is block diagram that illustrates one non-limiting method for securing a die to a leadframe of a semiconductor device in accordance with the present invention. The method for connecting the die to the leadframe is used to inhibit or prevent delamination of the die at the interface of the die attach/mold compound and the die pad of a semiconductor device.

The first step of the method of the present invention is the step of applying a coating of organosilane onto the surface of the leadframe. The coating of organosilane is applied by spray coating the organosilane onto the surface of the leadframe. The metal surface of the leadframe is typically gold or a gold alloy; however, the surface of the leadframe can be formed of or include other or additional metals (e.g., silver, copper, nickel, palladium, etc.). The thickness of the coating of organosilane on the surface of the leadframe is typically in the range of 10 nm to 2 µm. Different organosilanes can be coated on the surface of the leadframe. The organosilane typically includes sulfur, nitrogen and/or phosphorous functional groups. Non-limiting examples of organosilane that can be used in the present invention include 2-(2-pyridylethyl)-thiopropyltrimethoxysilane, bis [3-(triethoxysilyl)propyl]-tetrasulfide, 2-(Diphenylphosphino) ethyltriethoxysilane, (Aminoethylaminomethyl) phenethyltrimethoxysilane, and 3-Aminopropyltriethoxysilane. After the coating of organosilane is applied to the surface of the leadframe, a second layer of silane is applied to the top of the first layer (e.g., spray-coating, etc.). This second layer forms covalent bonds with the first layer through a sol-gel process (hydrolysis and condensation). The purpose of this second layer is to introduce functional groups (e.g., amine and epoxide groups, etc.) that can react with the epoxy in die attach and mold compound formulations. Non-limiting specific examples of silanes that can be used in the second layer include 3-Aminopropyltrimethoxysilane, 3-Glycidyloxypropyl) trimethoxysilane, diethylaminotrimethylsilane (DEATS), siloxanes, Dow Corning® Z-6300 Silane (e.g., Vinyltrimethoxysilane), Dow Corning® Z-6011 Silane (e.g., Gamma-Aminopropyl triethoxysilane), Xiameter® OFS-6030 Silane (e.g., Methacryloxypropyl trimethoxysilane), Xiameter® OF S-6040 Silane (e.g., Glycidoxypropyl trimethoxysilane), and Xiameter® OFS-6341 Silane (e.g., Triethoxyoctylsilane). As can be appreciated, the second silane layer can be formed of one or more of the compounds listed above, or some other or additional silane compound.

Figure 2:
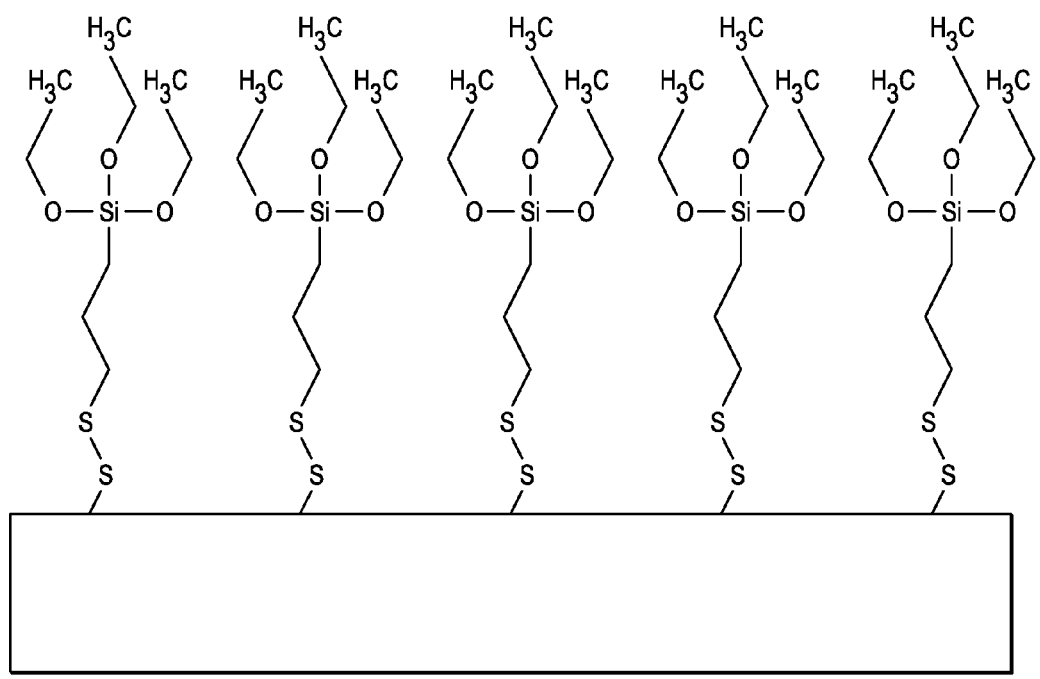
FIG. 2 is an enlarged illustration of a sulfur covalent bond between the sol-gel layer and the leadframe; and, FIG. 3 is an enlarged illustration of the sol-gel layer having a plurality of functional groups extending upwardly from the surface of the leadframe.
Figure 3:
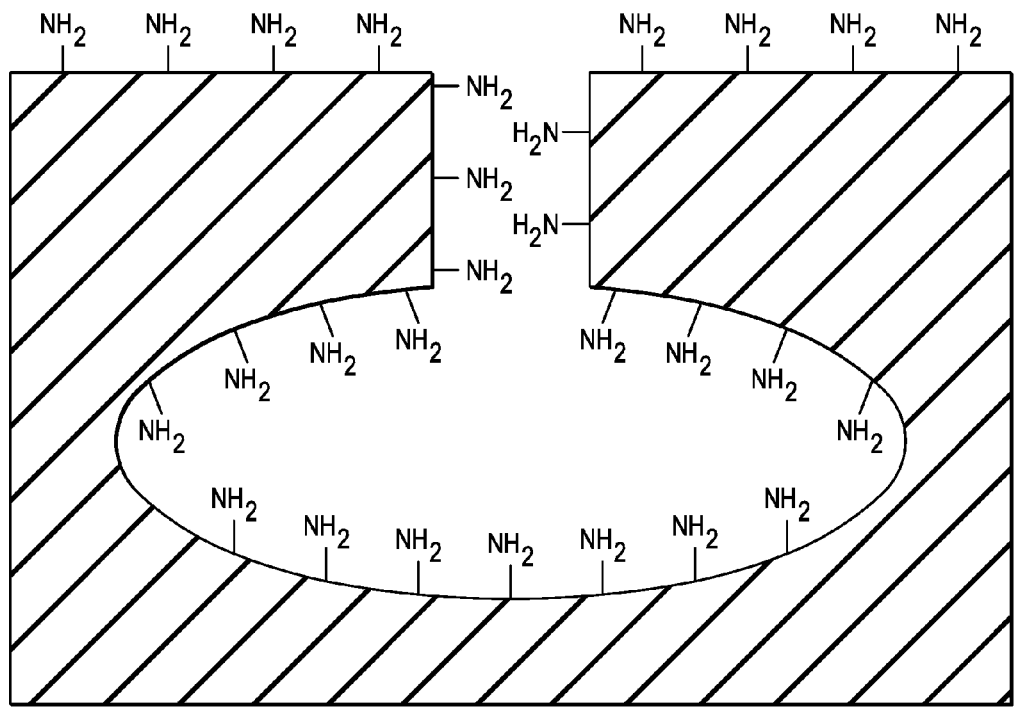

Once the organosilane is coated onto the surface of the leadframe, the organosilane is heated to cause the organosilane to form a porous sol-gel on the surface of the leadframe. FIG. 2 illustrates a sulfur covalent bond that is formed between the sol-gel and the leadframe. As such, if the leadframe is formed of gold, the formed chemical bond would be an Au—S chemical bond. FIG. 3 illustrates the sol-gel having a plurality of functional groups extending upwardly from the surface of the leadframe. The functional groups are illustrated as being —$NH_2$ functional groups; however, it will be appreciated that many other types of functions groups can be formed depending on the particular organosilane used to form the sol-gel. The coating of organosilane is typically heated at 80° C.-140° C. for 3-90 minutes. The coating of organosilane typically is heated at a certain temperature for a sufficient period of time so as to achieve a porosity of the formed sol-gel layer of 20%-60%. The thickness of the formed sol-gel layer is generally 2-20 µm (e.g., 2 µm, 2.01 µm, 2.02 µm . . . 19.98 µm, 19.99 µm, 20 µm) and all values or ranges there between.

After the sol-gel layer has been formed on the surface of the leadframe, a die attaching compound is used to connect the die to the sol-gel layer. The die attaching compound generally includes an epoxy or acrylate compound. The porous channels in the sol-gel layer as illustrated in FIG. 3 enable the formation of mechanical interlocking between the sol-gel layer and the die attaching compound. The functional groups in the sol-gel layer at the pore channel wall also react with the die attaching compound to form strong covalent bonds between the sol-gel layer and the die attaching compound. The formation of both mechanical interlocking and covalent bonds substantially improves the adhesion strength between the sol-gel layer and the die attaching compound, thus inhibiting or preventing die pad delamination.

After the die and die attaching compound is applied to the surface of the sol-gel layer, the die attaching compound is cured in an air environment or nitrogen environment for 2 minutes to 60 minutes. The curing temperature is generally 150° C.-220° C.

After the die attaching compound has been sufficiently cured, a mold compound is applied over the die. The mold compound is generally an epoxy compound. Generally, the mold compound has a different formulation from the die attaching compound. The mold compound is generally cured for 4-8 hours at a temperature of 150° C.-220° C.

It will thus be seen that the objects set forth above, among those made apparent from the preceding description, are efficiently attained, and since certain changes may be made in the constructions set forth without departing from the spirit and scope of the invention, it is intended that all matter contained in the above description and shown in the accompanying drawings shall be interpreted as illustrative and not in a limiting sense. The invention has been described with reference to preferred and alternate embodiments. Modifications and alterations will become apparent to those skilled in the art upon reading and understanding the detailed discussion of the invention provided herein. This invention is intended to include all such modifications and alterations insofar as they come within the scope of the present invention. It is also to be understood that the following claims are intended to cover all of the generic and specific features of the invention herein described and all statements of the scope of the invention, which, as a matter of language, might be said to fall therebetween. The invention has been described with reference to the preferred embodiments. These and other modifications of the preferred embodiments as well as other embodiments of the invention will be obvious from the disclosure herein, whereby the foregoing descriptive matter is to be interpreted merely as illustrative of the invention and not as a limitation. It is intended to include all such modifications and alterations insofar as they come within the scope of the appended claims.

What is claimed:

1. A method for inhibiting or preventing delamination at the interface of the die attach/mold compound and the die pad of a semiconductor device comprising:
    providing a leadframe having a first surface;
    applying a first silane on said first surface of said leadframe to form a first coating layer, said first silane includes at least one functional group selected from a sulfur functional group, a nitrogen functional group, and a phosphorus functional group;
    applying a second silane to said first coating layer to form a second coating layer, said second silane formed of one or more different compounds from said first silane;
    heating said first and second coating layers to form a porous layer having a porosity of at least 10%;
    applying a die to said porous layer;
    at least partially securing said die to said porous layer by a die attaching compound; and
    applying a mold compound at least partially over the said die and said leadframe.

2. The method as defined in claim 1, wherein a boiling point of said first silane is at least 130° C.

3. The method as defined in claim 1, wherein said step of heating includes heating said first and second coatings for at least 1 minute at a temperature of at least 60° C. until said porosity of said porous layer is between 10-60%.

4. The method as defined in claim 2, wherein said step of heating includes heating said first and second coatings for at least 1 minute at a temperature of at least 60° C. until said porosity of said porous layer is between 10-60%.

5. The method as defined in claim 1, wherein said first silane includes one or more compounds selected from the group consisting of bis[3-(triethoxysilyl)propyl]-tetrasulfide, 2-(Diphenylphosphino) ethyltriethoxysilane, (Aminoethylaminomethyl) phenethyltrimethoxysilane, and 3-Aminopropyltriethoxysilane.

6. The method as defined in claim 4, wherein said first silane includes one or more compounds selected from the group consisting of bis[3-(triethoxysilyl)propyl]-tetrasulfide, 2-(Diphenylphosphino) ethyltriethoxysilane, (Aminoethylaminomethyl) phenethyltrimethoxysilane, and 3-Aminopropyltriethoxysilane.

7. The method as defined in claim 1, wherein said second silane includes one or more compounds selected from the group consisting of 3-Aminopropyltrimethoxysilane, 3-Glycidyloxypropyl) trimethoxysilane, diethylaminotrimethylsilane, siloxanes, vinyltrimethoxysilane, gamma-Aminopropyl triethoxysilane, methacryloxypropyl trimethoxysilane, glycidoxypropyl trimethoxysilane, and triethoxyoctylsilane.

8. The method as defined in claim 6, wherein said second silane includes one or more compounds selected from the group consisting of 3-Aminopropyltrimethoxysilane, 3-Glycidyloxypropyl) trimethoxysilane, diethylaminotrimethylsilane, siloxanes, vinyltrimethoxysilane, gamma-Aminopropyl triethoxysilane, methacryloxypropyl trimethoxysilane, glycidoxypropyl trimethoxysilane, and triethoxyoctylsilane.

9. The method as defined in claim 1, wherein said leadframe includes a metal selected from the group consisting of gold, silver, copper, nickel and palladium, said porous layer forming one or more chemical bonds with said leadframe selected from the group consisting of an Au—S chemical bond, an Au—P chemical bond, an Au—N chemical bond, a Cu—S chemical bond, a Cu—P chemical bond, a Cu—N chemical bond, an Ag—S chemical bond, an Ag—P chemical bond, an Ag—N chemical bond, a Ni—S chemical bond, a Ni—P chemical bond, a Ni—N chemical bond, a Pd—S chemical bond, a Pd—P chemical bond and a Pd—N chemical bond.

10. The method as defined in claim 8, wherein said leadframe includes a metal selected from the group consisting of gold, silver, copper, nickel and palladium, said porous layer forming one or more chemical bonds with said leadframe selected from the group consisting of an Au—S chemical bond, an Au—P chemical bond, an Au—N chemical bond, a Cu—S chemical bond, a Cu—P chemical bond, a Cu—N chemical bond, an Ag—S chemical bond, an Ag—P chemical bond, an Ag—N chemical bond, a Ni—S chemical bond, a Ni—P chemical bond, a Ni—N chemical bond, a Pd—S chemical bond, a Pd—P chemical bond and a Pd—N chemical bond.

11. The method as defined in claim 1, further including the steps of a) at least partially curing said die attaching compound, b) performing a wire bonding process on said die, and c) using a molding process to apply said mold compound over said die and said die attaching compound, said die and said die attaching compound at least partially encapsulated or fully encapsulated between said mold compound and said porous layer, said leadframe, or combinations thereof.

12. The method as defined in claim 11, further including the step of curing said mold compound.

13. The method as defined in claim 1, wherein said porous layer has a thickness between 2-20 μm.

14. A semiconductor device comprising a leadframe, a die, a porous layer and a die attaching compound, wires, mold compound, said porous layer positioned in a first surface of said leadframe and having a chemical bond with said leadframe, said chemical bond including one or more bonds formed by an element selected from the group consisting of nitrogen, sulfur and phosphorous, said porous layer having a porosity of at least 10%, said die connected to said porous layer by said die attaching compound, said die attaching compound having a different formulation from said porous layer.

15. The semiconductor device as defined in claim 14, wherein said porous layer includes first and second silanes that have been exposed to heat, said first silane includes at least one functional group selected from a sulfur functional group, a nitrogen functional group, and a phosphorus functional group, said second silane includes at least one functional group selected from amines, epoxide and vinyl in a second layer.

16. The semiconductor device as defined in claim 15, wherein said first silane includes a compound selected from the group consisting of bis[3-(triethoxysilyl)propyl]-tetrasulfide, 2-(Diphenylphosphino) ethyltriethoxysilane, (Aminoethylaminomethyl) phenethyltrimethoxysilane, and 3-Aminopropyltriethoxysilane, said second silane includes a compound selected from the group consisting of 3-Glycidyloxypropyl) trimethoxysilane, diethylaminotrimethyl silane, siloxanes, vinyltrimethoxysilane, gamma-Aminopropyl triethoxysilane, methacryloxypropyl trimethoxysilane, glycidoxypropyl trimethoxysilane, and triethoxyoctylsilane.

17. The semiconductor device as defined in claim 14, wherein said leadframe includes a metal selected from the group consisting of gold, silver, copper, nickel and palladium, said one or more chemical bonds between said porous layer and said leadframe selected from the group consisting of an Au—S chemical bond, an Au—P chemical bond, an Au—N chemical bond, a Cu—S chemical bond, a Cu—P chemical bond, a Cu—N chemical bond, an Ag—S chemical bond, an Ag—P chemical bond, an Ag—N chemical bond, a Ni—S chemical bond, a Ni—P chemical bond, a Ni—N chemical bond, a Pd—S chemical bond, a Pd—P chemical bond and a Pd—N chemical bond.

18. The semiconductor device as defined in claim 14, wherein said die and said die attaching compound are at least partially encapsulated or fully encapsulated between a mold compound and said porous layer, said leadframe, or combinations thereof.

19. The semiconductor device as defined in claim 14, wherein said porous layer has an average a thickness of between 2-20 μm.

\* \* \* \* \*